(12) United States Patent
Blondiaux et al.

(10) Patent No.: US 11,434,131 B2
(45) Date of Patent: *Sep. 6, 2022

(54) METHODS FOR MANUFACTURING MICROMECHANICAL COMPONENTS AND METHOD FOR MANUFACTURING A MOULD INSERT COMPONENT

(71) Applicant: CSEM Centre Suisse d'Electronique et de Microtechnique SA—Recherche et Développement, Neuchâtel (CH)

(72) Inventors: Nicolas Blondiaux, Les Geneveys-sur-Coffrane (CH); Raphaël Pugin, Colombier (CH)

(73) Assignee: CSEM CENTRE SUISSE D'ELECTRONIQUE ET DE MICROTECHNIQUE SA—RECHERCHE ET DÉVELOPPEMENT, Neuchâtel (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/178,032

(22) Filed: Feb. 17, 2021

(65) Prior Publication Data

US 2021/0171340 A1 Jun. 10, 2021

Related U.S. Application Data

(63) Continuation of application No. 16/431,073, filed on Jun. 4, 2019, now Pat. No. 10,954,123.

(30) Foreign Application Priority Data

Jun. 5, 2018 (EP) ..................... 18175930

(51) Int. Cl.
*B81C 99/00* (2010.01)
*B81C 1/00* (2006.01)
(Continued)

(52) U.S. Cl.
CPC ...... *B81C 99/0085* (2013.01); *B81C 1/00103* (2013.01); *B81C 1/00484* (2013.01);
(Continued)

(58) Field of Classification Search
CPC .............. B81C 99/0085; B81C 99/009; B81C 1/00103; B81C 1/00484; B81C 2201/034;
(Continued)

(56) References Cited

U.S. PATENT DOCUMENTS 4,309,488 A 1/1982 Heide
4,900,483 A 2/1990 Witzke
(Continued)

FOREIGN PATENT DOCUMENTS

CH 706621 12/2013
WO 2007/012114 2/2007

OTHER PUBLICATIONS

Fenollosa et al., "Porous silicon microspheres: synthesis, characterization and application to photonic microcavities", J. Mater. Chem., 2010, 20, 5210-5214.
(Continued)

*Primary Examiner* — Shamim Ahmed
(74) *Attorney, Agent, or Firm* — Duane Morris LLP; Gregory M. Lefkowitz; Randall C. Pyles

(57) ABSTRACT

Method of manufacturing a micromechanical component intended to cooperate with another micromechanical component, the method comprising the steps of providing a substrate, forming a mould on said substrate, said mould defining sidewalls arranged to delimit said micromechanical component, providing particles on at least said sidewalls, depositing a metal in said mould so as to form said micromechanical component, and liberating said micromechanical component from said mould and removing said particles.

22 Claims, 6 Drawing Sheets

(51) Int. Cl.
　　*B81B 5/00*　　　(2006.01)
　　*B82Y 40/00*　　(2011.01)
(52) U.S. Cl.
　　CPC .............. *B81C 99/009* (2013.01); *B81B 5/00* (2013.01); *B81B 2201/035* (2013.01); *B81B 2201/036* (2013.01); *B81C 2201/034* (2013.01); *B82Y 40/00* (2013.01)
(58) Field of Classification Search
　　CPC ................ B81B 2201/036; B81B 5/00; B81B 2201/035; B82Y 40/00
　　See application file for complete search history.

(56) References Cited

U.S. PATENT DOCUMENTS

| | | |
|---|---|---|
| 2005/0067286 A1 | 3/2005 | Ahn et al. |
| 2009/0041986 A1 | 2/2009 | Zhang et al. |
| 2014/0349061 A1 | 11/2014 | Sikka |
| 2016/0160436 A1 | 6/2016 | Lyons |
| 2018/0194619 A1 | 7/2018 | Greer |

OTHER PUBLICATIONS

Puurunen, "Formation of Metal Oxide Particles in Atomic Layer Deposition During the Chemisorption of Metal Chlorides: A Review", Chem. Vap. Deposition, 2005, 11, No. 2, pp. 79-90.
Krishna et al., "Thickness-dependent spontaneous dewetting morphology of ultrathin Ag films", Nanotechnology, 21, 155601, Mar. 19, 2010, pp. 1-7.

METHODS FOR MANUFACTURING MICROMECHANICAL COMPONENTS AND METHOD FOR MANUFACTURING A MOULD INSERT COMPONENT

CROSS REFERENCE TO RELATED APPLICATIONS

This application is a continuation of U.S. application Ser. No. 16/431,073, filed Jun. 4, 2019, which claims priority to European Application No. 18175930.9, filed Jun. 5, 2018, the entire contents of which are incorporated herein by reference.

TECHNICAL FIELD

The present invention relates to the technical field of micromechanics. More particularly, it relates to methods of manufacturing micromechanical components and to a method of manufacturing a mould insert component for the manufacture of a micromechanical component.

STATE OF THE ART

Micromechanical components, such as horological components, MEMS components and so on, are often required to interact kinematically with each other by frictional contact.

Such components, which may for instance be gear wheels, levers, cams and so on, typically have dimensions of the order of several hundred microns of thickness, and diameters or lengths ranging from several millimetres to several centimetres. Due to the extremely small size of such components, predetermined surface finishes are required for tribological reasons. The typical approach for such finishing is to first manufacture the components, and then subject them to a surface treatment such as polishing, roughening or similar, as required depending on the properties needed.

However, more advanced surface finishes are often desirable so as to optimise friction and/or handling of lubricants by optimising the wetting of the surface.

These surface finishes can be applied to the components e.g. by laser ablation, trowalisation, plasma treatment, dry or wet etching etc., with or without a mask.

For finishing treatments such as trowalisation or dry-wet etching without a mask, the surface structures obtained have well defined length-scales but have random shapes with non-optimal tribological properties. Other techniques such as anodization lead to better defined surface structures but are limited to specific materials (e.g. aluminium or titanium etc.). Laser ablation can be used to fabricate well defined surface structures at the sub-microscale but is limited in terms of throughput and feasibility when processing complex 3D microparts.

In another process, it is known to deposit an adhesion layer on the otherwise-completed component, upon which micro- or nano-particles can be deposited. A subsequent mask inversion and etching step creates hollows in the surface.

Although they allow the surface structuring of sidewalls of parts, such processes are time-consuming and are carried out on otherwise complete components, adding process steps to their manufacture and requiring handling of otherwise-finished components. The sidewalls are the areas of the components which are typically subject to friction, particularly in the case of gearwheels and similar, and it is thus highly desirable to be able to influence their properties for tribological and lubrication-related reasons during their formation rather than as extra steps.

An aim of the present invention is thus to at least partially overcome the above-mentioned drawbacks of the prior art.

DISCLOSURE OF THE INVENTION

According to a first aspect, the invention relates to a method of manufacturing a micromechanical component intended to interact with another micromechanical component via a frictional contact, such as a horological component or a MEMS component, more specifically e.g. a gear wheel, a lever, a cam, a rack, an anchor, a ratchet, a jumper spring, a sliding component, a clutch, a cam follower, a mainspring housing or similar with predefined, well-defined surface structures on their sidewalls. This method comprises the steps of:

providing a substrate, e.g. made of silicon or other suitable material;

forming a mould directly or indirectly on said substrate, said mould defining sidewalls delimiting said micromechanical component, i.e. defining its shape. Photostructurable SU-8 polymer is a non-limiting example of a material suitable for such a mould, and is well-known in the context of the LIGA process; alternatives can be thermal nanoimprint or UV-nanoimprint (also referred as UV-casting);

providing particles on said mould, namely on at least said sidewalls thereof, either by depositing already-formed particles thereupon or by forming/growing said particles in situ;

depositing a metal such as nickel, phosphor bronze, nickel-phosphor, brass, copper or other suitable metal in said mould so as to form said micromechanical component, e.g. by electroforming or by electroless plating as appropriate;

liberating said micromechanical component from said mould and removing said particles in the same step or in a subsequent step.

It should be noted that extra intermediate steps are not excluded by this method, or by any other method of the invention.

As a result, it is possible to structure the sidewalls of the component in a controlled fashion, with surface cavities defined in function of the type and size of said particles, in a simple step during manufacture of the component rather than in a post-formation step requiring complicated handling and extra processing. This permits optimisation of the tribological properties of the sidewalls of the component, and retention of lubricant (if applicable) during manufacture and without further finishing being required.

According to a second aspect, the invention relates to a method of manufacturing a mould insert component intended for the manufacture of a micromechanical component intended to interact with another micromechanical component via a frictional contact, e.g. of the types mentioned above. This method comprises the steps of:

providing a substrate made e.g. of silicon or another suitable material;

forming a mould on said substrate, said mould defining sidewalls delimiting the shape of said mould insert. Photostructurable SU-8 polymer is a non-limiting example of a material suitable for such a mould, and is well-known in the context of the LIGA process;

providing particles on at least said sidewalls, either by depositing already-formed particles thereupon or by forming them in-situ;

depositing a metal in said mould so as to form said mould insert component, said metal being e.g. nickel, phosphor bronze, nickel-phosphor, brass, copper or other suitable metal e.g. by electroforming or by electroless plating as appropriate;

liberating said mould insert component from said mould and removing said particles.

The sidewalls of the mould insert component are thus structured as described above, this structure being transferred to a final micromechanical component formed by using a moulding tool provided with the mould insert (see below), thus enabling the final component to have structured sidewalls as described above.

Advantageously, in either aspect of the invention, the particles may have at least one dimension ranging from 1 nm to 10 µm, preferably from 10 nm to 8 µm, further preferably from 50 nm to 5 µm, and can be deposited in a single layer or in two or more layers so as to form a hierarchical structure or a porous surface. In the case of two or more layers, each layer may comprise particles having either similar dimensions to make a porous surface or substantially different dimensions to make a hierarchical structured surface. In the case of hierarchical structures, the particles of one layer having preferably at least twice the diameter of those of the other layer, further preferably at least five times said diameter, even further preferably at least ten times said diameter.

Advantageously, a further step of depositing an adhesion layer at least on said sidewalls prior to providing said particles can be performed, so as to improve the adhesion of the particles on the sidewalls of the mould.

Advantageously, the particles can also be deposited directly or indirectly upon said substrate, which prevents any masking of the substrate from being necessary to selectively deposit particles only on the sidewalls.

Advantageously, the methods can further comprise a step of removing excess metal prior to liberating the component or said mould insert component from said mould, as is the case.

The particles may comprise e.g. at least one organic material such as melamine, polyimide, polysulfone, polystyrene, polystyrenesulfonic acid, polystyrene sulfonate, polyacrylate, or polymethylmetacrylate; copolymers (incl. block-, graft and star-copolymer) such as particles made of polystyrene-polymethylmetacrylate; polystyrene-polyvinylpyrine, polystyrene-polyethyleneoxide and/or inorganic substances such as titanium oxide, silicon oxide, aluminium oxide, zinc oxide, or nickel oxide. In the case of multiple layers of particles, each layer may comprise the same or different particles, and the particles may be hybrids comprising both inorganic and organic components, and/or different types of particles in the same layer.

The particles can be deposited by a wet deposition technique such as immersion coating, spray coating, spin coating or dip coating.

A third aspect of the invention relates to a method of manufacturing a micromechanical component intended to interact with another micromechanical component via a frictional contact, the method comprising the steps of:

manufacturing a moulding tool comprising a mould insert component as defined above, said mould insert component at least partially defining the shape of the micromechanical component;

depositing material (such as metal, bulk metallic glass, polymer, ceramic or similar) into said moulding tool by any convenient process so as to form said micromechanical component;

liberating said micromechanical component from said moulding tool.

This method likewise results in the structure of the particles being transferred to the final micromechanical component as discussed above, since the surface-structured mould insert component serves to define at least partially the shape of the micromechanical component.

In another variant, the method of manufacturing a micromechanical component intended to interact with another micromechanical component via a frictional contact, the method comprising the steps of:

forming a moulding tool comprising a mould insert component as mentioned above;

depositing material into said moulding tool so as to form a further mould insert component;

liberating said further mould insert component from said moulding tool;

forming a further moulding tool comprising said further mould insert component;

depositing material into said further moulding tool so as to form said micromechanical component;

liberating said micromechanical component from said further moulding tool.

This enables, for instance, mass production of the final components by means of a sacrificial further mould insert manufactured with the help of a durable mould insert.

The material used to fill the moulding tool or the further moulding tool may be polymer, metal, bulk metallic glass, ceramic, diamond-like carbon, or a combination of materials. As a result, the sidewall structuring can be applied to micromechanical components made of any mouldable material.

Advantageously, the moulding tool is an injection moulding tool comprising a cavity defined at least partially by said mould insert, and wherein said material is deposited by injection moulding of molten polymer into said cavity.

The invention also relates to a micromechanical component obtainable and/or obtained by one of the above-mentioned methods, as well as to a mould insert component obtainable and/or obtained by the corresponding methods mentioned above.

It should be noted that the various features of the methods can be combined in any way which makes technical sense.

BRIEF DESCRIPTION OF THE DRAWINGS

Further details of the invention will appear more clearly upon reading the description below, in connection with the following figures which illustrate.

EMBODIMENTS OF THE INVENTION

Figure 1:
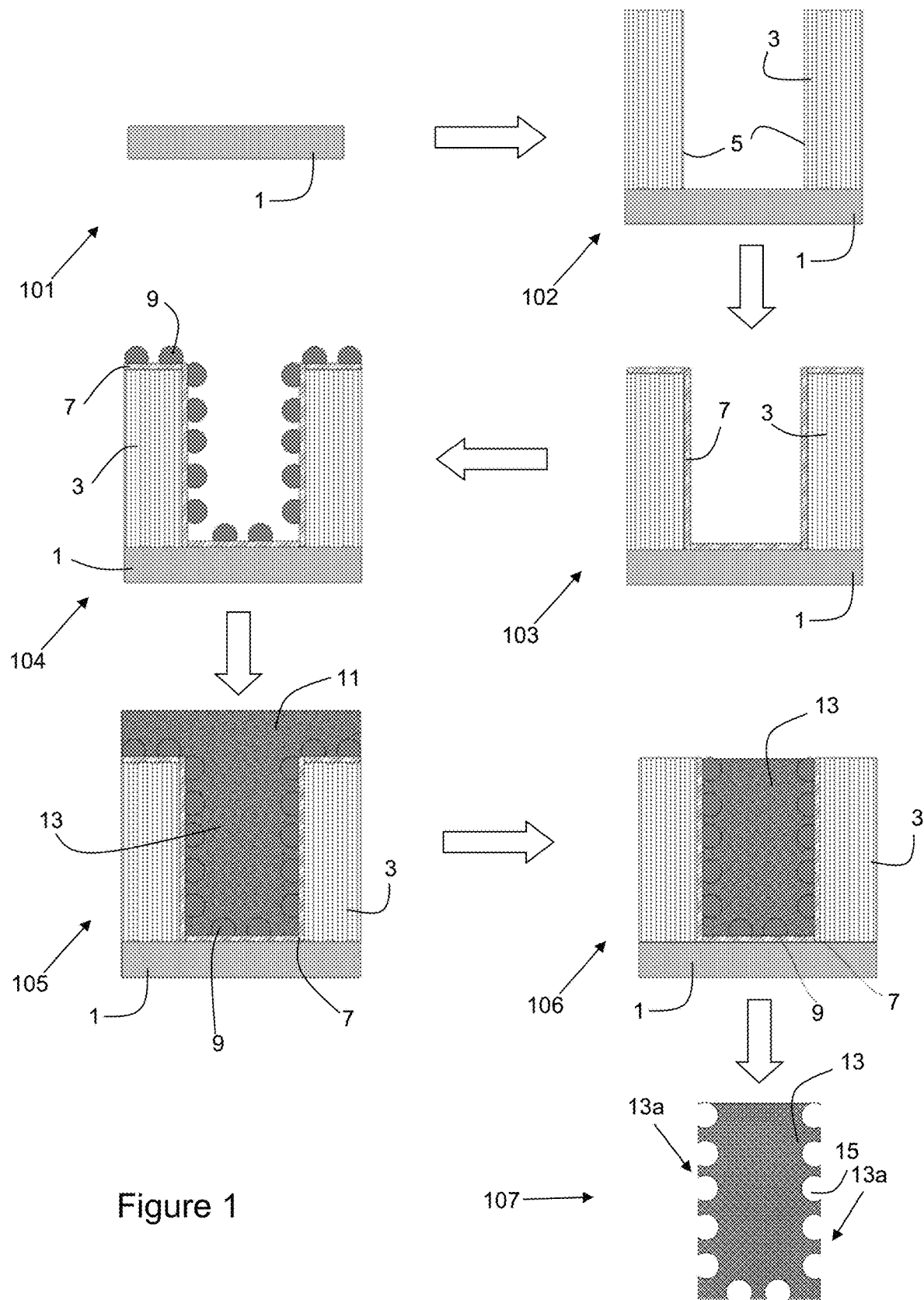
FIG. 1 illustrates schematically a first embodiment of a method of manufacturing a micromechanical component according to the invention.

FIG. 1 illustrates a first embodiment of a method of manufacturing a micromechanical component 13 according to a method of the invention, said micromechanical component being intended to cooperate with another micromechanical component (which may or may not itself be made according to the invention) via a frictional contact, this frictional contact being either static and/or dynamic. This component 13 may be a horological or MEMS component, and may for instance be a gear wheel, a rack, a ratchet, a lever, a cam, a mainspring housing, a jumper spring, an anchor, a clutch, a sliding component, or any other component intended to interact with another via a frictional contact. This contact is typically via the sidewalls of the component 13, these sidewalls joining two faces of the component which each define a plane and which are typically parallel with each other. In other words, the sidewalls do not themselves meet in a sharp point, but rather join with a plane which is at an angle thereto. Typically, the component has a minimum dimension of 0.1 mm considered in this plane, and is hence not a needle-type structure, but is rather a component defining a plane. The micromechanical component 13 may be intended for a horological application, a MEMS application, or any other micromechanical application. To this end, MEMS is defined as micromechanical systems manufacturable by micromachining technology such as LIGA, etching and so on.

In step 101, a substrate 1 is provided. This is typically made of silicon, which can be monocrystalline, polycrystalline, or amorphous, or can be another substance such as a metal, silicon oxide, silicon nitride, silicon carbide or similar. It can also be e.g. silicon provided with surface layer of another material. Substrate 1 may be flat, or may be curved or otherwise structured.

In step 102, a mould 3 is formed on the substrate 1, e.g. by deposition and selective removal of material. Typically, the mould 3 is of SU-8 epoxy resin or other negative-type resins (although positive-type resins are also possible), which is selectively photostructured by means of a mask or by direct laser exposure, the unexposed portions being removed by an appropriate solvent. However, other similar processes are known in the art, such as direct laser ablation of mask material. The mould 3 thus obtained comprises sidewalls 5 which delimit the sidewalls of the component 13 when this latter has been formed. In the variant illustrated in FIG. 1, these sidewalls 5 are substantially perpendicular to the substrate 1. However, they can also be angled, for instance so as to produce a conical gear, or other micromechanical component comprising angled sidewalls.

In step 103, an adhesion layer 7 is deposited on the mould 3 (including its sidewalls 5) and the exposed parts of the substrate 1. This adhesion layer 7 promotes the adhesion of particles 9 in step 104, and is an optional step in the case in which adhesion of the particles 9 directly with the mould 3 is adequate. In this latter case, the adhesion layer 7 illustrated in the figures should be deemed to be absent.

The adhesion layer can for instance comprise a molecular film of bifunctional molecules having a high affinity for the surface of the mould 3 (their first functionality) and for the particles coated on the surface (their second functionality). Examples of such substances are functional silanes having amine functionality, thiols having a carboxylic acid, amine, phosphonic acid, amide, trimethylammonium bromide functionality, sulfonates having amine, thiol, carboxylic acid, phosphonic acid, amide, phosphonates having a carboxylic acid, amine, phosphonic acid, amide, trimethylammonium bromide and more generally random or block-copolymers. Alternatively, linear, branched or dendritic macromolecules with functional groups having a high affinity for both the surface of the mould and the particles can be used. Examples of such substances are PAMAM (Poly(amidoamine)), polyethylene imine, polystyrene sulfonate, polyacrylic acid, polydiallyldimethylammonium chloride, and polylysine. Alternatively, metal salts such as polyaluminium chloride can be used or functional silsesquioxanes. A yet further possibility is a thin film of metal oxide such as AlOx, SiOx, or TiOx. A yet further possibility for the prime layer is a dual layer formed of combinations of two layers of the examples given above with for instance a layer of metal oxide and a bifunctional molecule or a linear, branched or dendritic macromolecule.

Depending on the substance chosen for the adhesion layer, it can be deposited either by wet deposition techniques such as immersion coating, spray coating, spin coating, and dip coating, or by vacuum deposition techniques such as atomic layer deposition, molecular vapor deposition and so on.

In step 104, particles 9 of a size preferably ranging from 1 nm to 10 μm, further preferably from 10 nm to 8 μm, even further preferably from 50 nm to 5 μm, are provided on the adhesion layer 7 or directly on the mould 3 and substrate 1 if the adhesion layer 7 is not used. It should also be noted that it is possible, although difficult, to mask the exposed parts of the substrate 1 such that the particles 9 are only provided on the sidewalls 5 and the upper surface of the mould material and not on the exposed parts of the substrate 1 or of the adhesion layer 7 situated thereupon. Particles 9 may be substantially spherical, cylindrical, rods, polyhedral (prisms, cubes, cuboids, octahedra, pyramids, tetrahedra and so on), or may be of irregular form. In such cases, the size ranges given above refer to their major (i.e. longest) dimension.

These particles 9 may comprise organic materials such as melamine, polyimide, polysulfone, polystyrene, polystyrenesulfonic acid, polystyrene sulfonate, polyacrylate, polymethylmetacrylate, or similar. The particles could also comprise at least two types of monomer or polymer subunits as found in copolymers (incl. block-, graft and star-copolymer) such as particles made of polystyrene-polymethylmetacrylate; polystyrene-polyvinylpyrine, polystyrene-polyethyleneoxide. The particles could also be inorganic substances such as titanium oxide, silicon oxide, aluminium oxide, zinc oxide, nickel oxide or similar. Alternatively, they can be hybrid composite particles comprising both organic and inorganic components. The particles 9 are typically provided on the surfaces in question by being deposited thereupon as already-formed particles, which may e.g. be deposited by wet deposition techniques including immersion coating, spray coating, spin coating, dip coating and similar.

Other processes are possible in which the particles 9 are formed in situ, such as vacuum deposition techniques including chemical vapor deposition (CVD), atomic layer deposition (ALD) which allow the deposition of conformal coatings with specific growth mode (dewetting of the growing material, nucleation and growth). As reported by Puurrunen et al "Formation of Metal Oxide Particles in Atomic Layer Deposition During the Chemisorption of Metal Chlorides: A Review" Chem. Vap. Deposition, 2005, 11: 79-90, the ALD process can be used for the fabrication of metal oxide nanoparticles. Fenollosa et al reported in "Porous silicon microspheres: synthesis, characterization and application to photonic microcavities" J. Mat. Chem. 20, 5210-5214 (2010) that submicron silicon particles can be produced by CVD. Another possible process for the deposition of particles is the combination of thin film deposition and sintering processes. Coatings deposited by vacuum techniques (e.g. ALD, CVD, PVD, evaporation techniques or similar) have been combined with an annealing step to induce dewetting of a thin film of particle precursor and formation of droplets which form the particles 9. This process has been used for photovoltaics and has been used for the fabrication of light trapping layers (Krishna et al, Nanotechnology, Volume 21, Issue 15, article id. 155601, 7 pp. (2010)).

Subsequently, in step 105 the mould 3 is filled with metal 11 for instance by electrolytic deposition or by electroless (autocatalytic) deposition so as to form the component 13 in the mould 3. One face of the component 13 is defined by the substrate 1. Such deposition processes are extremely well-known in the art, particularly in the context of the LIGA process, and do not need to be discussed in detail here. Suitable metals are nickel, brass, copper, phosphor bronze, nickel phosphor and many other metals used for microme-chanical components and which can be deposited in bulk.

In step 106, excess metal 11a is removed by mechanical polishing, leaving the component 13 in the mould 3.

Finally, in step 107, the component 13 is removed from the mould, the particles 9 being removed at the same time or subsequently, for instance by mechanical, solvents, acidic or basic solutions and/or plasma removal of the mould 3 together with any adhesion layer 7. The complete removal of the mould and particles 9 may be achieved in a single step depending on the materials of the particles or in a two steps process to remove sequentially the mould and the particles. The resulting component typically has a thickness of between 100 μm and 3 mm, and dimensions perpendicular to said thickness of the order of 10 μm to 20 mm. preferably from 100 μm to 10 mm It can clearly be seen that the sidewalls 13a of the component are textured, having taken on the negative form of the sidewalls 5 of the mould 3 and the particles 9 previously deposited thereupon, these particles 9 each having left a corresponding cavity 15 in the component 13. It should thus be clear that the surface finish of the sidewalls 13a of the component 13 can be varied by varying the size, density and distribution of particles 9 during their deposition in step 104.

Figure 2:
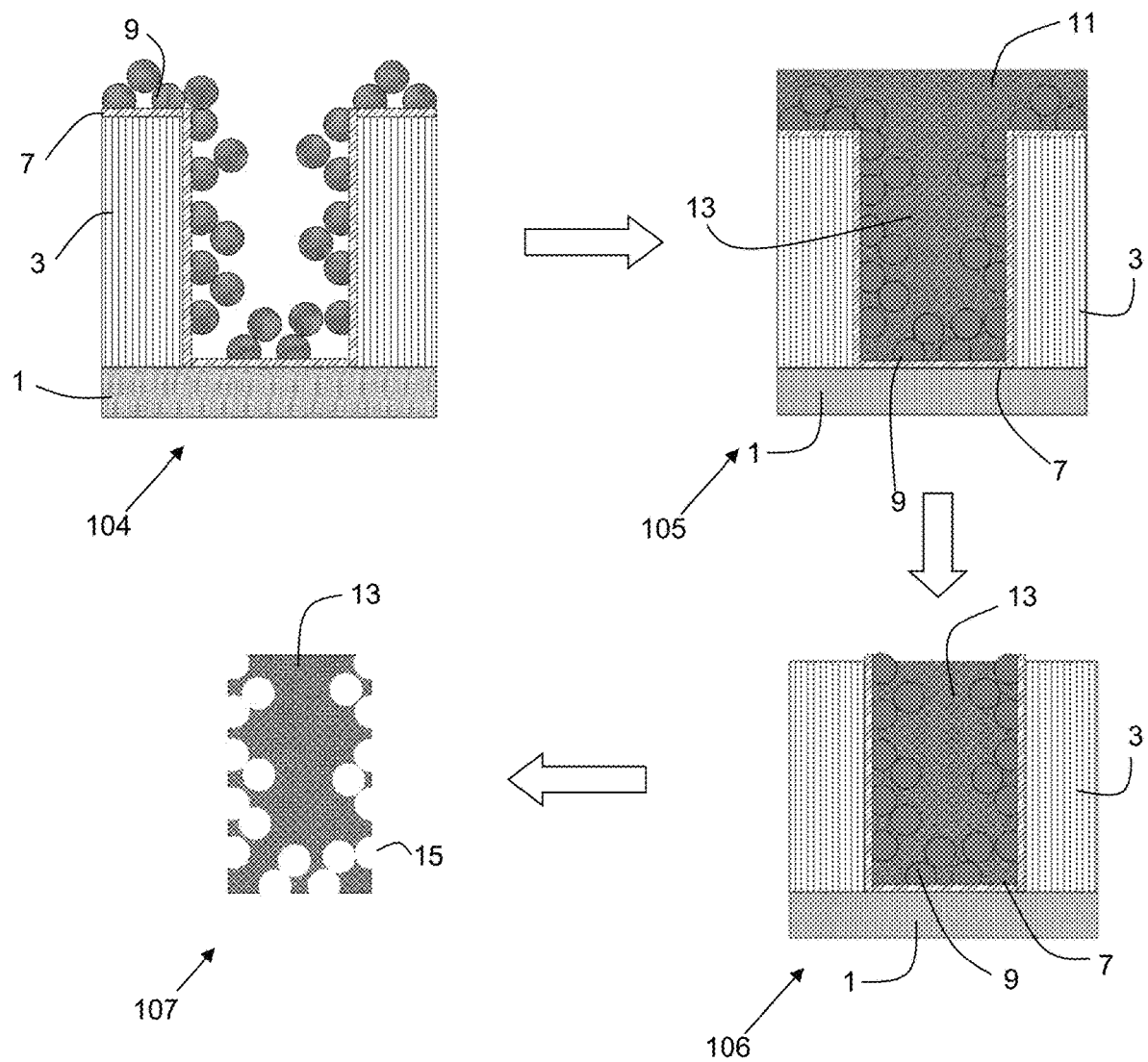
FIG. 2 illustrates schematically and partially a second embodiment of a method of manufacturing a micromechanical component according to the invention.

FIG. 2 illustrates this principle applied to step 104 of the method, in which several layers of particles 9 are deposited or formed in-situ on the adhesion layer 7 (or directly on the mould 3 and substrate 1 if no adhesion layer is present). The particles 9 of each layer may have the same or similar diameters, or may be different sizes. For instance, larger particles 9 may be deposited or formed in contact with the adhesion layer 7 with smaller particles deposited or formed thereupon so as to provide a hierarchical texture to the finished component 13, with smaller cavities provided inside larger ones. In such a case, the particles 9 provided directly on the adhesion layer 7 may have a diameter at least 5 or 10 times larger than that of the smaller particles 9 provided thereupon, preferably around 10 times larger (i.e. from 8 to 12 times larger) to have a sufficient particle density, Steps 105 to 107 follow as before, with the double textured structure of the component 13 being clearly visible as indicated in step 107, the cavities 15 taking the negative shape of the multiple layers of particles 9.

Figure 3:
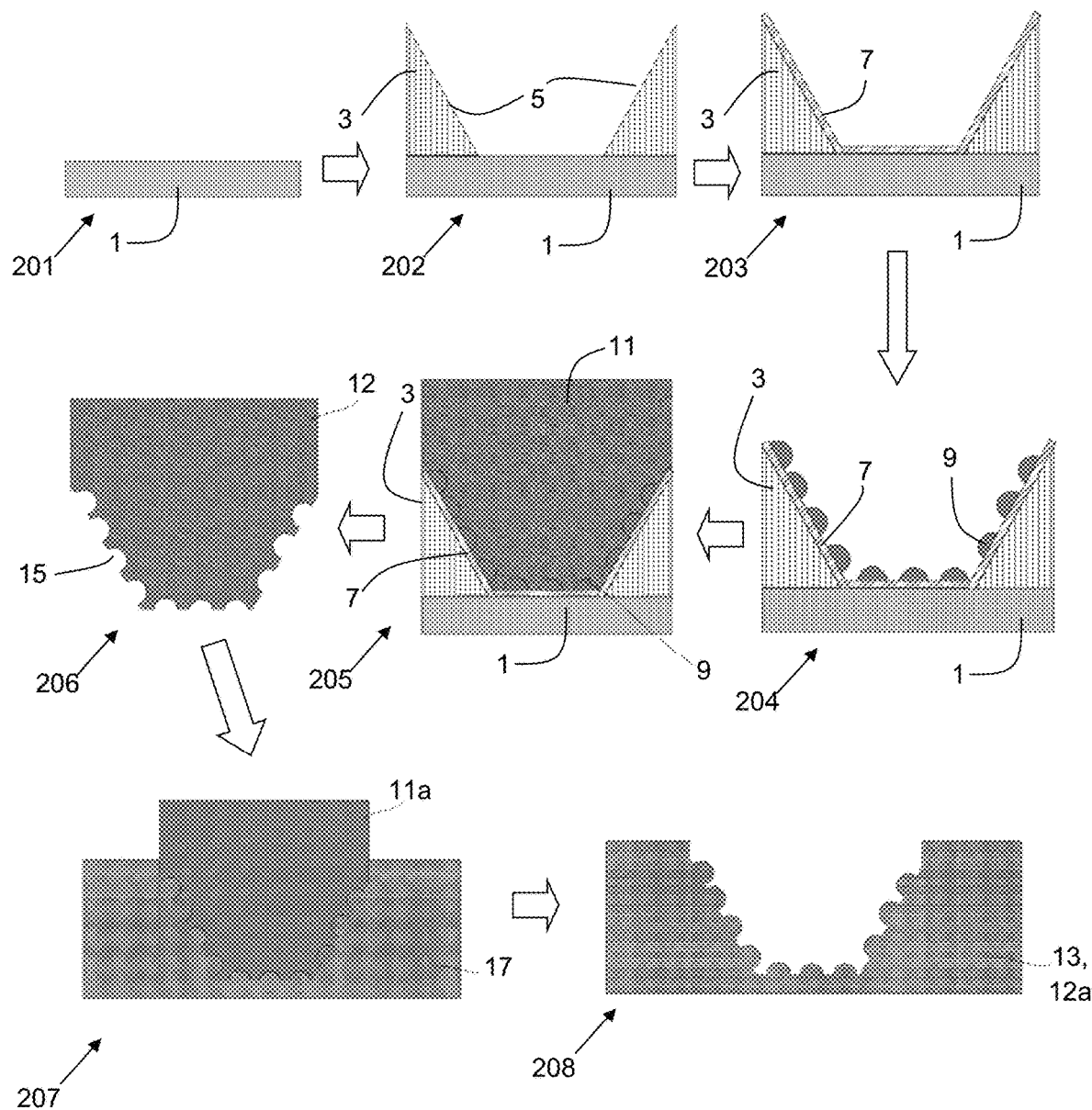
FIG. 3 illustrates schematically a method of manufacturing a mould insert component and of manufacturing a micromechanical component or a further mould insert component according to a method of the invention.

FIG. 3 illustrates a method according to the invention of manufacturing a mould for a micromechanical component, as well as manufacturing the final component 13.

Steps 201 to 206 correspond to steps 101 to 106 of FIG. 1 and need not be re-described, except in reference to the following differences.

Instead of defining the micromechanical component 13 directly, the mould 3 is shaped so as to form a mould insert component 12 intended to be integrated into a moulding tool (such as an injection moulding tool) for producing the final component 13 by moulding after the mould insert component 12 has been liberated from the mould 3. As such, the mould insert component 12 serves to define at least part of the cavity in a moulding tool which defines the shape of the component 13. In the illustrated embodiment, this mould insert component intended to be mounted in an injection moulding tool (not illustrated), but other types of moulding tools (hot embossing, UV-casting, sintering, electrodeposition, electroless deposition and so on) are also possible. As a result, the mould 3 substantially conforms to the shape of the final component 13, since this method is a positive-negative-positive process. Since the sidewalls of the mould insert component 12 are textured, they should be arranged so as to form a taper sufficient to permit extraction of the component 13 without damage from the mould formed using the mould insert component 12.

Hence, steps 201 to 206 define a method of manufacturing a mould insert component 12 for the manufacture of a micromechanical component 13, and subsequent steps 207 and 208 complete the manufacture of the component 13.

In step 207, the mould insert component 12 has been mounted in a moulding tool, such as an injection moulding tool, so as to define a cavity delimiting the micromechanical component 13, and material 17 has been deposited therein. In the case of injection moulding, this material is molten polymer material or UV-curable resin which has been injected therein so as to form the component 13. This material is then allowed to solidify. Other types of moulding tools are also possible, and the material 17 may be deposited by sintering, electroforming, electroless deposition, CVD, PVD, ALD or any other method which is suitable in respect of the material chosen. This material can e.g. be polymer, metal, bulk metallic glass, ceramic, diamond-like carbon, or similar, suitable for the deposition process chosen.

In step 208, the component 13 is removed from the mould. The component 13 as illustrated may for instance be an interior conical gear such as may be used in a spherical differential gear. To form exterior gears, the shape of the initial mould 3 can be adjusted as required.

Figure 4:
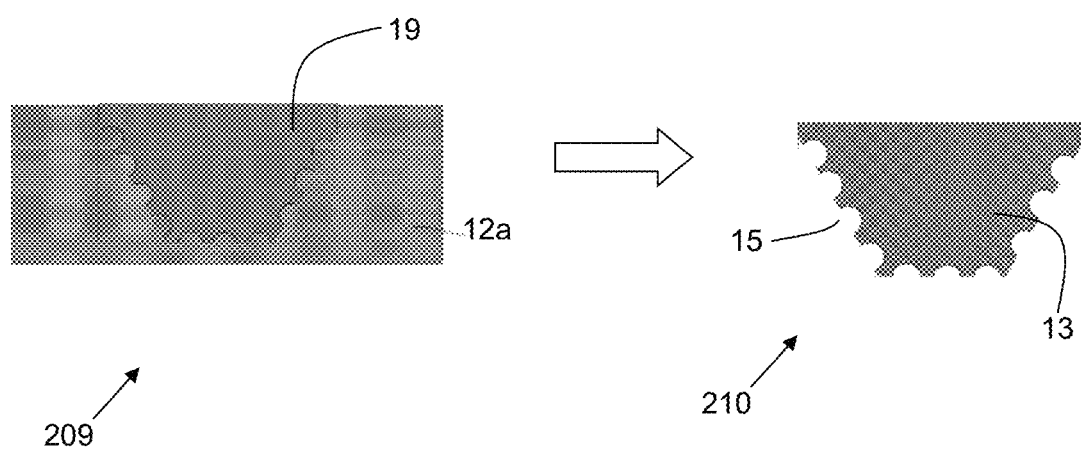
FIG. 4 illustrates schematically steps subsequent to those of FIG. 3 in respect of a further method of manufacturing a micromechanical component according to the invention on the basis of said further mould insert.

The method of FIG. 3 can also be modified such that the component 13 as illustrated therein is in fact a further mould insert component 12a which is then subsequently mounted in a further moulding tool used to produce the component 13 in the two further steps illustrated in FIG. 4. The further mould insert component 12a thus forms part or the entirety of a further mould forming a cavity defining the shape of the final component 13. This results in a negative-positive-negative-positive process, in which each of these stages comprises respectively the mould 3, the first mould comprising the mould insert component 12, a further mould comprising the further mould insert component 12a, and the final component 13.

In step 209, this further moulding tool is filled with material 19, e.g. by injection moulding, sintering, electroforming, electroless deposition, CVD, PVD, ALD or any other method which is suitable in respect of the material chosen. This material can e.g. be polymer, metal, ceramic, diamond-like carbon, or similar.

In step 210, the final component 13 is liberated from the further mould. If the mould defined using the further mould insert component 12a is overfilled (as is the case in step 105 of FIG. 1), a step of mechanically removing excess material as in step 106 can also be performed.

The further mould insert component 12a may be durable if it is made of a relatively hard material such as metal, ceramic, or similar or may be sacrificial if it is made of polymer or other soft material. In fact, this longer process is particularly useful in the case in which the mould insert component 12 is durable (e.g. made of metal, ceramic or similar wear-resistant material) and the further mould insert component 12a is sacrificial, since many further mould insert components 12a can be inexpensively fabricated by means of the mould insert component 12, which only needs to be produced in small numbers.

Figure 5A:
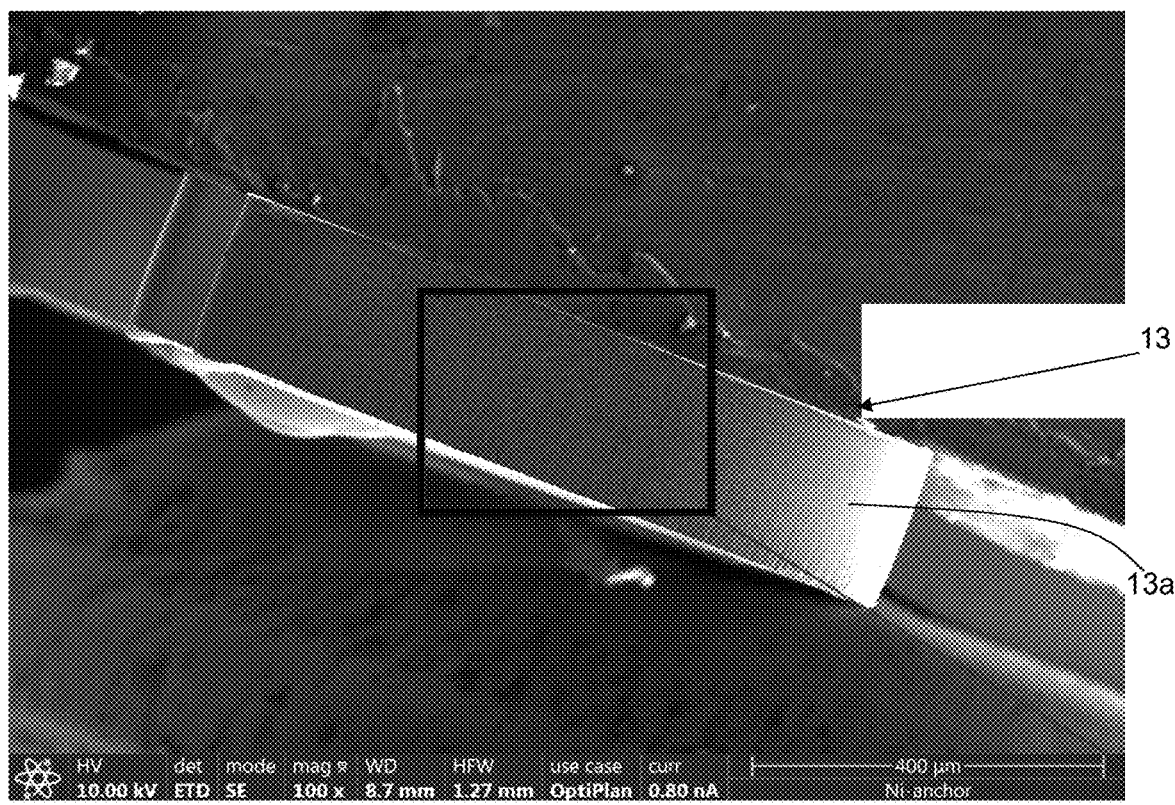
FIGS. 5*a-d* are electron micrographs at various resolutions illustrating results obtained with the method of the invention.
Figure 5B:
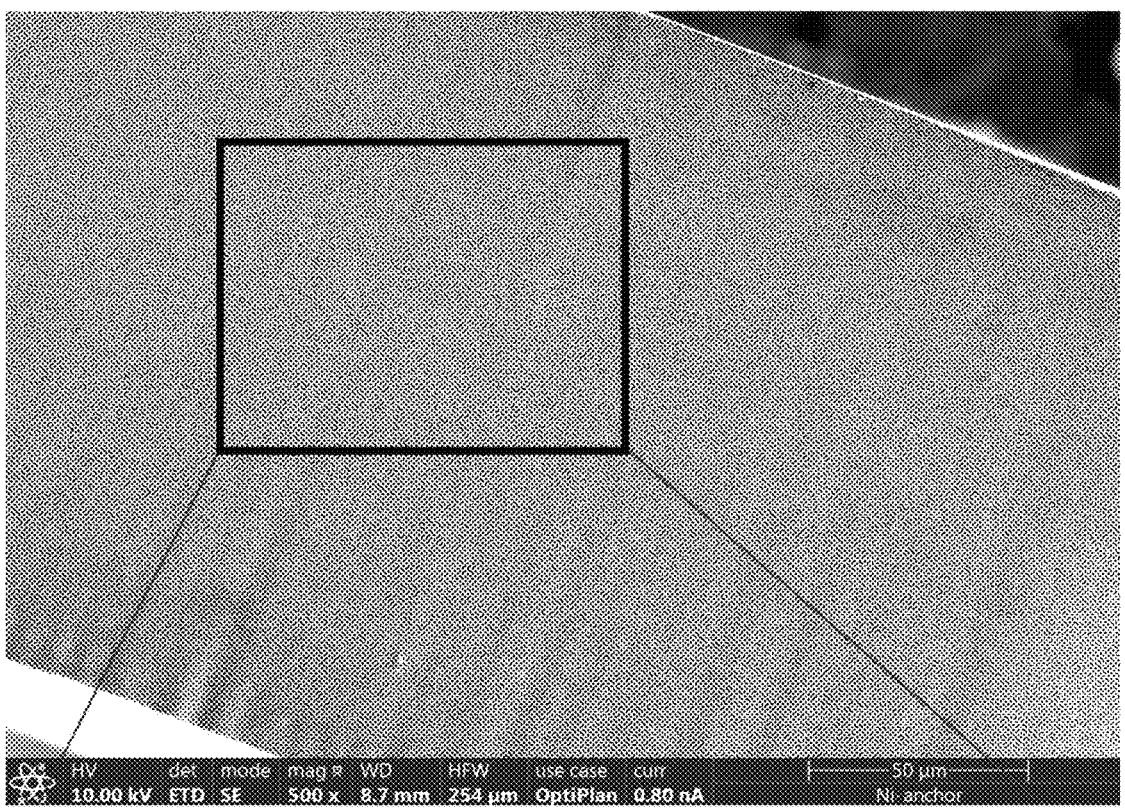
Figure 5C:
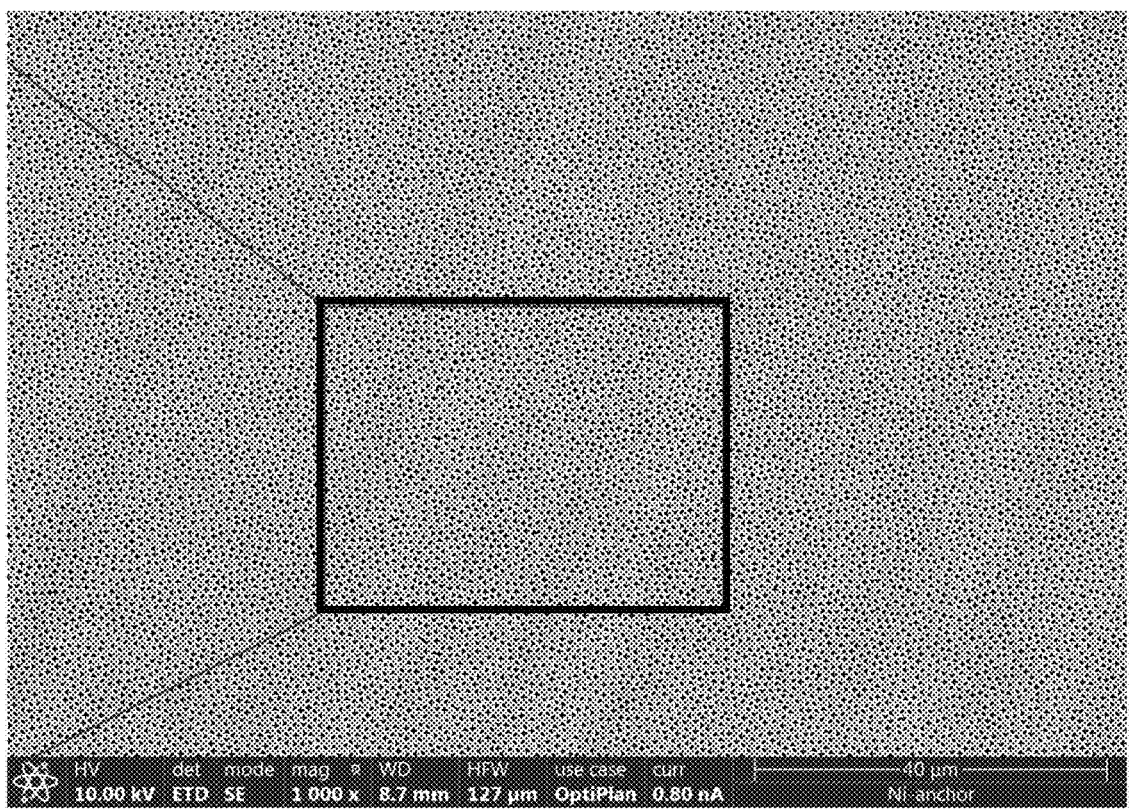
Figure 5D:
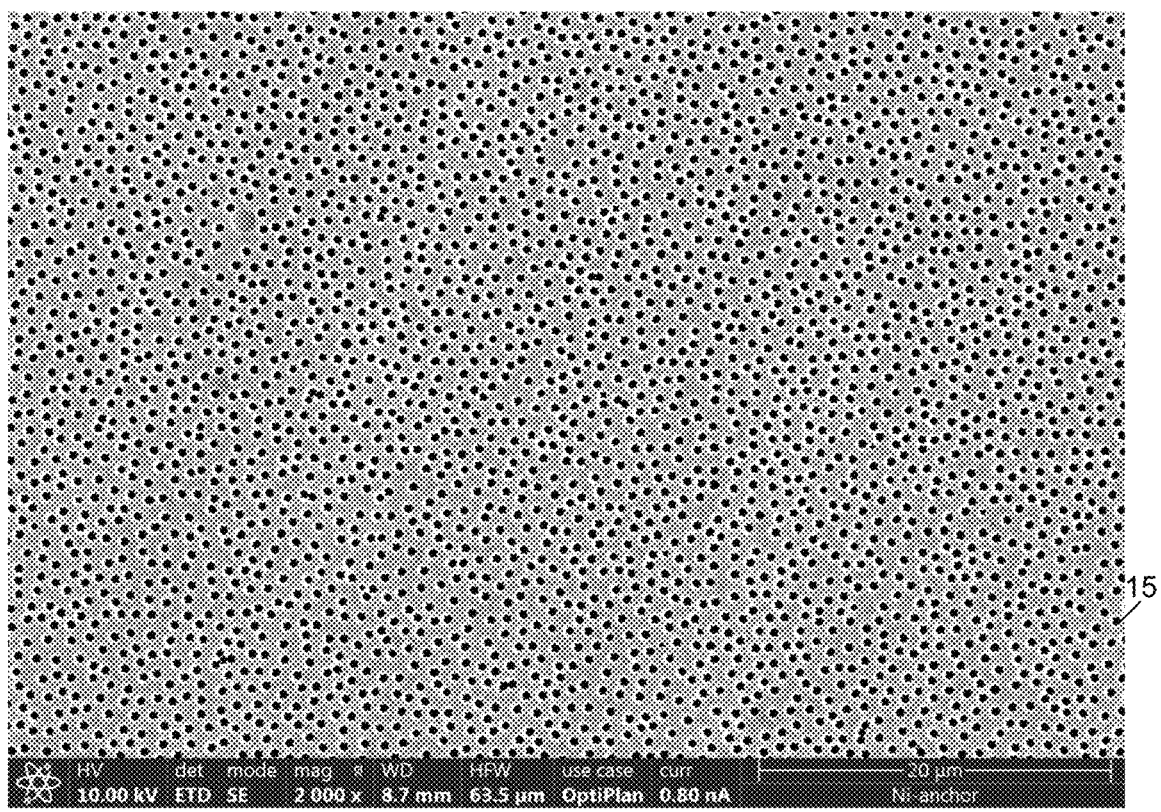

FIGS. 5a-d are electron micrographs of a side surface of a horological anchor manufactured by a method according to the invention, at various magnifications. FIG. 5b is corresponds to the area inside the black rectangle of FIG. 5a, FIG. 5c corresponds to the area inside the black rectangle of FIG. 5b, and FIG. 5d corresponds to the area inside the black rectangle of FIG. 5c.

In this test, a silicon wafer (thickness: 1 mm, orientation: (111)) constituting the substrate 1 was coated with gold. After applying a 200 µm coating of SU-8 photoresist, a photolithography step was carried out to form a mould 3 delimiting the lateral dimensions of the parts to be produced and the sidewalls of these parts. The surface of the SU-8 coated substrate 1 was activated using a barrel oxygen plasma. A layer of polyethylene imine (constituting adhesion layer 7) was deposited on the SU-8 in a conformal way by immersion coating. Polystyrene particles 9 were then deposited in a conformal way on the all of the mould 3, sidewalls 5 included, by immersion coating. The surface of the SU-8 mould 3 coated with adhesion layer 7 and particles 9 was activated using a barrel oxygen plasma. A 200 µm layer of nickel 11 was then electroplated in the mould using a nickel sulfamate bath so as to form the part 13.

After liberation from the mould 3 and removal of the particles with toluene, the part 13 was placed under an electron microscope to obtain the images of its sidewall reproduced here, these images clearly showing the cavities 15, each with a diameter of around 0.5 µm, caused by the presence of the particles 9 in the mould 3. These cavities provide a texture to the sidewall surface.

Although the invention has been described in terms of specific embodiments, variations thereto are possible without departing from the scope of the invention as defined by the appended claims.

The invention claimed is:

1. A method of manufacturing a micromechanical component intended to interact with another micromechanical component via a frictional contact, comprising the steps of:
providing a substrate; subsequently
forming a mould on said substrate, said mould defining sidewalls arranged to delimit said micromechanical component; subsequently
providing particles on at least said sidewalls; subsequently
depositing a metal in said mould so as to form said micromechanical component; subsequently
liberating said micromechanical component from said mould and removing said particles.

2. The method according to claim 1, wherein said particles have at least one dimension ranging from 1 nm to 10 µm.

3. The method according to claim 2, wherein said particles are provided in at least two layers, each layer comprising particles having substantially different dimensions, the particles of one layer having at least twice the diameter of those of the other layer.

4. The method according to claim 2, wherein said particles are provided in at least two layers, each layer comprising particles having substantially the same diameter.

5. The method according to claim 1, wherein said particles are also provided upon said substrate.

6. The method according to claim 1, wherein said particles comprise
at least one organic material selected from melamine, polyimide, polysulfone, polystyrene, polystyrenesulfonic acid, polystyrene sulfonate, polyacrylate, polymethylmetacrylate, polystyrene-polymethylmetacrylate copolymer, polystyrene-polyvinylpyrine
polymer, or polystyrene-polyethyleneoxide copolymer; and/or
inorganic substances selected from titanium oxide, silicon oxide, aluminium oxide, zinc oxide, or nickel oxide.

7. The method according to claim 1, wherein said particles are provided by deposition, comprising depositing particles by a wet deposition technique selected from immersion coating, spray coating, spin coating or dip coating.

8. The method according to claim 1, wherein said particles are provided by being formed in situ, by one of chemical vapour deposition, atomic layer deposition, or physical vapour deposition.

9. A method of manufacturing a mould insert component adapted for the manufacture of a micromechanical component by moulding, said micromechanical component being intended to cooperate with another micromechanical component via frictional contact, said method comprising the steps of:
providing a substrate; subsequently
forming a mould on said substrate, said mould defining sidewalls arranged to delimit said mould insert; subsequently
providing particles on at least said sidewalls; subsequently
depositing a metal in said mould so as to form said mould insert component; subsequently
liberating said mould insert component from said mould and removing said particles.

10. The method according to claim 9, wherein said particles have at least one dimension ranging from 1 nm to 10 µm.

11. The method according to claim 10, wherein said particles are provided in at least two layers, each layer comprising particles having substantially different dimensions, the particles of one layer having at least twice the diameter of those of the other layer.

12. The method according to claim 10, wherein said particles are provided in at least two layers, each layer comprising particles having substantially the same diameter.

13. The method according to claim 9, wherein said particles are also provided upon said substrate.

14. The method according to claim 9, wherein said particles comprise
at least one organic material selected from melamine, polyimide, polysulfone, polystyrene, polystyrenesulfonic acid, polystyrene sulfonate, polyacrylate, polymethylmetacrylate, polystyrene-polymethylmetacrylate copolymer, polystyrene-polyvinylpyrine copolymer, or polystyrene-polyethyleneoxide copolymer; and/or
inorganic substances selected from titanium oxide, silicon oxide, aluminium oxide, zinc oxide, or nickel oxide.

15. The method according to claim 9, wherein said particles are provided by deposition, by depositing particles by a wet deposition technique selected from immersion coating, spray coating, spin coating or dip coating.

16. The method according to claim 9, wherein said particles are provided by being formed in situ, by one of chemical vapour deposition, atomic layer deposition, or physical vapour deposition.

17. A method of manufacturing a micromechanical component intended to interact with another micromechanical component via a frictional contact, the method comprising the steps of:
- forming a moulding tool comprising a mould insert component according to the method of claim 9;
- depositing material into said moulding tool so as to form said micromechanical component;
- liberating said micromechanical component from said moulding tool.

18. The method according to claim 17, wherein said material comprises at least one of be polymer, metal, ceramic, or diamond-like carbon.

19. The method according to claim 17, wherein said moulding tool is an injection moulding tool comprising a cavity defined at least partially by said mould insert, and wherein said material is deposited by injection moulding of molten polymer into said cavity.

20. A method of manufacturing a micromechanical component intended to interact with another micromechanical component via a frictional contact, the method comprising the steps of:
- forming a moulding tool comprising a mould insert component according to the method of claim 9;
- depositing material into said moulding tool so as to form a further mould insert component;
- liberating said further mould insert component from said moulding tool;
- forming a further moulding tool comprising said further mould insert component;
- depositing material into said further moulding tool so as to form said micromechanical component; and
- liberating said micromechanical component from said further moulding tool.

21. The method according to claim 20, wherein said material comprises at least one of be polymer, metal, ceramic, or diamond-like carbon.

22. The method according to claim 20, wherein said further moulding tool is an injection moulding tool comprising a cavity defined at least partially by said mould insert, and wherein said material is deposited by injection moulding of molten polymer into said cavity.

* * * * *